United States Patent [19]
Sharan et al.

[11] Patent Number: 6,143,620
[45] Date of Patent: *Nov. 7, 2000

[54] SEMICONDUCTOR PROCESSING METHOD OF PROVIDING A ROUGHENED POLYSILICON FILM AND A CAPACITOR CONSTRUCTION

[75] Inventors: Sujit Sharan; Thomas A. Figura, both of Boise, Id.

[73] Assignee: Micron Technology, Inc., Boise, Id.

[*] Notice: This patent is subject to a terminal disclaimer.

[21] Appl. No.: 09/197,090

[22] Filed: Nov. 19, 1998

Related U.S. Application Data

[63] Continuation of application No. 08/917,667, Aug. 21, 1997, Pat. No. 5,856,007, which is a continuation of application No. 08/504,183, Jul. 18, 1995, abandoned.

[51] Int. Cl.[7] .................................................. H01L 21/70
[52] U.S. Cl. ........................................ 438/398; 438/255
[58] Field of Search .................................. 438/398, 255, 438/964, 665, 663, 386

[56] References Cited

U.S. PATENT DOCUMENTS

| | | | |
|---|---|---|---|
| 5,037,773 | 8/1991 | Lee et al. ................................ | 437/60 |
| 5,102,832 | 4/1992 | Tuttle ...................................... | 437/231 |
| 5,112,773 | 5/1992 | Tuttle ...................................... | 437/109 |
| 5,244,842 | 9/1993 | Cathey et al. ........................... | 437/228 |
| 5,266,514 | 11/1993 | Tuan et al. .............................. | 437/52 |
| 5,302,540 | 4/1994 | Ko et al. .................................. | 437/47 |
| 5,318,920 | 6/1994 | Hayashide ............................... | 437/47 |
| 5,340,765 | 8/1994 | Dennison et al. ....................... | 437/52 |
| 5,342,800 | 8/1994 | Jun .......................................... | 437/52 |
| 5,354,705 | 10/1994 | Mathews et al. ........................ | 437/52 |
| 5,366,917 | 11/1994 | Watanabe etal. ....................... | 437/47 |
| 5,385,863 | 1/1995 | Tatsumi et al. ......................... | 437/109 |
| 5,418,180 | 5/1995 | Brown ..................................... | 437/60 |
| 5,583,070 | 12/1996 | Liao et al. ............................... | 437/52 |
| 5,597,754 | 1/1997 | Lou et al. ................................ | 437/52 |
| 5,656,531 | 8/1997 | Thakur et al. .......................... | 438/398 |
| 5,759,262 | 6/1998 | Weimer et al. ......................... | 117/88 |

FOREIGN PATENT DOCUMENTS

| | | |
|---|---|---|
| 5-175456 | 7/1993 | Japan . |
| 6-45521 | 2/1994 | Japan . |

*Primary Examiner*—Savitri Mulpuri
*Attorney, Agent, or Firm*—Wells, St. John, Roberts, Gregory & Matkin, P.S.

[57] ABSTRACT

A semiconductor processing method of providing a polysilicon film having induced outer surface roughness includes, a) providing a substrate within a chemical vapor deposition reactor; b) chemical vapor depositing an in situ conductively doped amorphous silicon layer over the substrate within the reactor at a first temperature, the first temperature being below 600° C., the doped amorphous silicon layer having an outer surface of a first degree of roughness; c) within the chemical vapor deposition reactor and after depositing the doped amorphous silicon layer, raising the substrate temperature at a selected rate to an annealing second temperature, the annealing second temperature being from 550° C. to 950° C.; and d) maintaining the substrate at the annealing second temperature for a period of time sufficient to convert the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the amorphous silicon layer and its conversion to polysilicon.

26 Claims, 3 Drawing Sheets

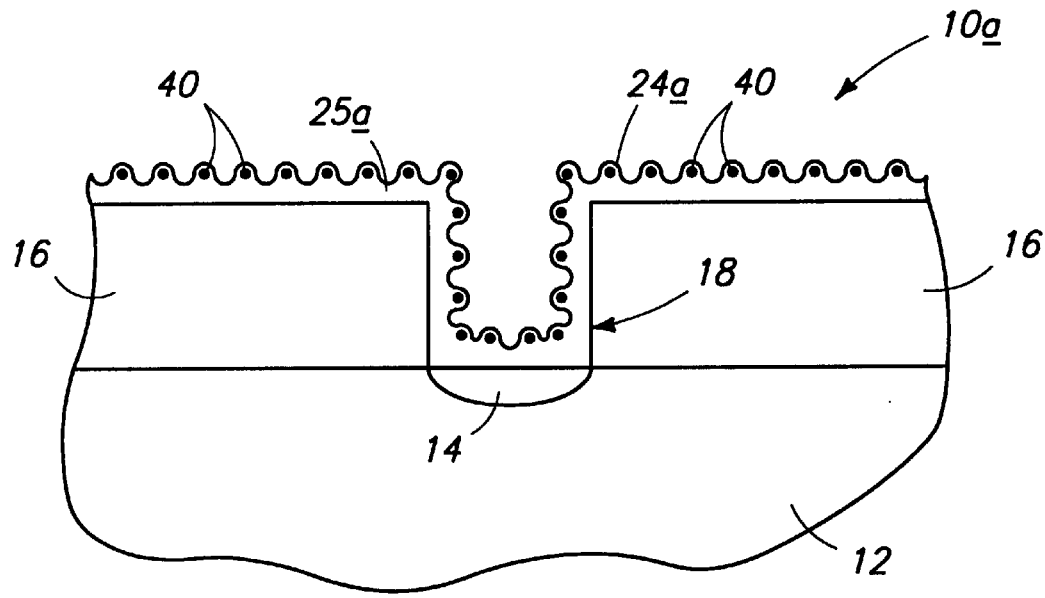
F I G 5
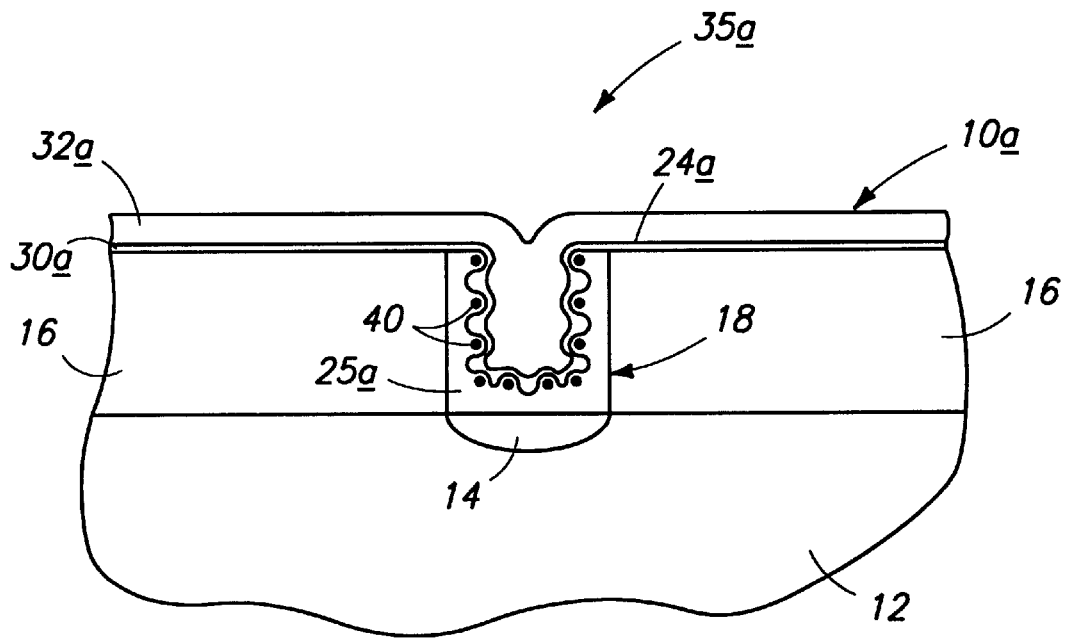
F I G 6

SEMICONDUCTOR PROCESSING METHOD OF PROVIDING A ROUGHENED POLYSILICON FILM AND A CAPACITOR CONSTRUCTION

RELATED PATENT DATA

This patent resulted from a continuation application of U.S. patent application Ser. No. 08/917,667, which was filed on Aug. 21, 1997, now U.S. Pat. No. 5,856,007, which is a file wrapper continuation of U.S. patent application Ser. No. 08/504,183, filed on Jul. 18, 1995, now abandoned.

TECHNICAL FIELD

This invention relates generally to semiconductor processing methods of providing a roughened polysilicon film and to capacitor constructions incorporating roughened polysilicon films.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for the capacitor plates is conductively doped polysilicon. Such material is so utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films s deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such techniques are inherently unpredictable or inconsistent in the production of a rugged polysilicon film.

One type of polysilicon film which maximizes outer surface area is hemispherical grain polysilicon. Such can be deposited or grown by a number of techniques. One technique includes direct LPCVD formation at 590° C. Another includes formation by first depositing an amorphous silicon film at 550° C. using He diluted $SiH_4$ (20%) gas at 1.0 Torr, followed by a subsequent high temperature transformation anneal. Hemispherical grain polysilicon is typically not, however, in situ doped during its deposition due to undesired reduction in grain size in the resultant film. Accordingly, methods must be utilized to conductively dope the hemispherical grain polysilicon after its deposition. To provide such doping, an underlayer of doped polysilicon can be provided, with subsequent high temperature doping of the HSG polysilicon layer occurring by an annealing step to drive the dopant outwardly. Alternately, dopant can be implanted into the polysilicon after its deposition from above, although such can have a tendency to smoothen the deposited HSG layer.

One example method for providing doped HSG poly is as follows. A doped layer of amorphous or polycrystalline silicon is provided atop substrate wafers by chemical vapor deposition within a suitable reactor. The wafers are removed from the reactor in ambient air which results in oxidation to produce a native oxide layer typically of 20 Angstroms or greater. During such fabrication, various wafers may remain in ambient air conditions for varying time periods of several hours to a few days prior to subsequent processing for forming an HSG polysilicon layer. To accommodate such varying thickness native oxide layers, the wafers are collectively cleaned in multiple HF dipping steps to remove the native oxide back to an exposed silicon layer. Then within two hours of the final strip, the wafers are provided within a chemical vapor deposition reactor.

With all wafers being processed having the common two hour or less exposure, each will have a substantially uniform thickness native oxide layer of 20 Angstroms. Provision of native oxide in this process is an understood requirement for formation of HSG polysilicon. Within the chemical vapor deposition reactor, the respective wafers are subjected to conditions suitable for formation of a continuous HSG polysilicon layer. At this point, the HSG layer is undoped and is subsequently subjected to suitable conditions in an effort to drive conductivity enhancing dopant ions from the underlying silicon layer through the native oxide layer and into the HSG layer. Such does not, however, typically provide a desired uniform and high dopant concentration within the HSG layer as would otherwise be provided were in situ HSG doping practical.

Other prior art techniques for developing roughened polysilicon outer surfaces exist. In one such process, an in situ conductively doped amorphous silicon layer is chemical vapor deposited over a substrate within a deposition reactor to a desired thickness. The wafers are then removed from the reactor for subsequent processing, such as patterning of the deposited amorphous layer. The processed wafers are then reloaded into the furnace and subjected to an HF vapor clean to remove native oxide. Subsequently, the wafers are annealed at approximately 600° C. and $10^{-8}$ Torr to prevent subsequent oxidation. Such also results in transformation of the amorphous silicon layer to a polycrystalline silicon layer. However, production of such very low vacuum pressures requires the purchase and operation of extremely expensive equipment.

Accordingly, needs remain for providing improved methods of producing roughened conductively doped polysilicon films for utilization in improved capacitor constructions.

BRIEF DESCRIPTION OF THE DRAWINGS

Preferred embodiments of the invention are described below with reference to the following accompanying drawings.

FIG. 5 is a view of the FIG. 4 wafer fragment at a processing step subsequent to that shown by FIG. 4.

FIG. 6 is a view of the FIG. 4 wafer fragment at a processing step subsequent to that shown by FIG. 5.

DETAILED DESCRIPTION OF THE PREFERRED EMBODIMENTS

Figure 1:
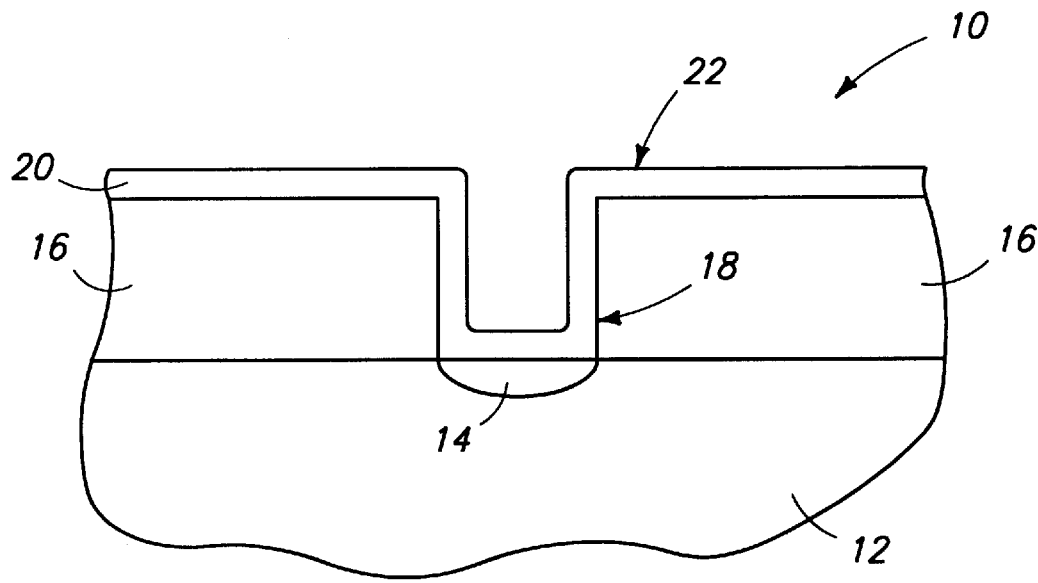
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing a polysilicon film having induced outer surface roughness comprises the following steps:

providing a substrate within a chemical vapor deposition reactor;

chemical vapor depositing an in situ conductively doped amorphous silicon layer over the substrate within the reactor at a first temperature, the first temperature being below 600° C., the doped amorphous silicon layer having an outer surface of a first degree of roughness;

within the chemical vapor deposition reactor and after depositing the doped amorphous silicon layer, raising the substrate temperature at a selected rate to a higher annealing second temperature, the annealing second temperature being from 550° C. to 950° C.; and maintaining the substrate at the annealing second temperature for a period of time sufficient to convert the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the amorphous silicon layer and its conversion to polysilicon.

In accordance with another aspect of the invention, a semiconductor processing method of providing a polysilicon film having induced outer surface roughness comprises the following steps:

providing a substrate within a chemical vapor deposition reactor;

chemical vapor depositing an in situ conductively doped amorphous silicon layer over the substrate within the reactor at a first temperature, the first temperature being below 600° C., the doped amorphous silicon layer having an outer surface of a first degree of roughness;

within the chemical vapor deposition reactor and after depositing the doped amorphous silicon layer, raising the substrate temperature at a selected rate to a higher silicon seeding temperature;

with the substrate at the seeding temperature, depositing a discontinuous layer of silicon seeds atop the doped amorphous silicon layer;

within the chemical vapor deposition reactor and after depositing the discontinuous layer of silicon seeds atop the doped amorphous silicon layer, providing the substrate at an annealing second temperature, the annealing second temperature being from 550° C. to 950° C.; and maintaining the substrate at the annealing second temperature for a period of time sufficient to convert the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the amorphous silicon layer and its conversion to polysilicon.

A capacitor construction employing such a roughened polysilicon film is also disclosed.

More particularly, with reference to the figures, FIG. 1 illustrates a semiconductor wafer fragment in process indicated generally with reference numeral 10. Such comprises a bulk semiconductor substrate 12 (typically p-doped monocrystalline silicon) having an n-type diffusion region 14 provided therein. Diffusion region 14 comprises a node to which electrical connection to a capacitor plate is to be made. A layer 16 of insulative silicon dioxide is provided over bulk substrate 12, and provided with a container opening 18 therein to diffusion region 14. The wafer is placed within a chemical vapor deposition reactor, and a layer 20 of in situ conductively doped amorphous silicon is chemical vapor deposited over the depicted substrate within the reactor at a first temperature which is below 600° C.

An example of preferred process for providing layer 20 would be to place the wafer in a six liter reactor with the wafer maintained at 560° C. and reactor pressure at 80 Torr. $SiH_4$ and phosphine are fed to the reactor at respective flow rates of 500 sccm and 300 sccm for 400 seconds. Such will produce a layer 20 having a thickness of approximately 1,000 Angstroms. By way of example only, disilane could be substituted for $SiH_4$ at a flow rate of 300 sccm while the other parameters remain constant. Such will produce layer 20 to approximately 1,000 Angstroms in 15 seconds. For purposes of the continuing discussion, doped amorphous silicon layer 20 has an outer surface 22 of a first degree of roughness.

Figure 2:
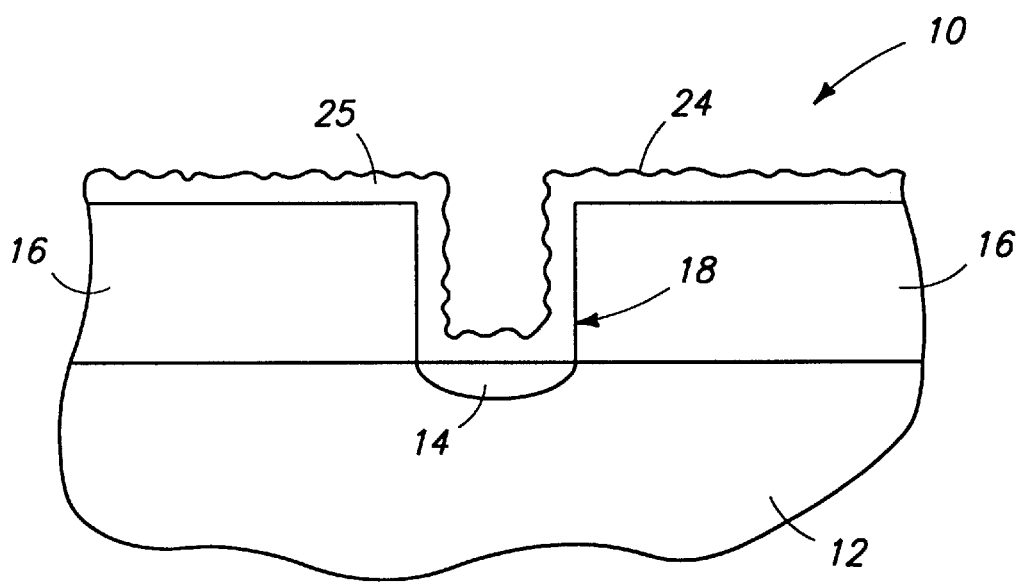
FIG. 2 is a view of the FIG. 1 wafer fragment at a processing step subsequent to that shown by FIG. 1.

Referring to FIG. 2, the substrate temperature within the reactor is raised at a selected rate to a higher annealing second temperature which is between 550° C. and 950° C. The substrate is maintained at the second annealing temperature for a period of time sufficient to convert doped amorphous silicon layer 20 into a doped polysilicon layer 25 having an outer surface 24 of a second degree of roughness which is greater than the first degree of roughness. Of critical significance in accordance with every aspect of this invention, substrate 10 is not removed from the reactor nor exposed to any oxidizing conditions between the time of deposition of amorphous silicon layer 20 and its conversion to polysilicon layer 25.

The selected ramp rate for the temperature increase is preferably less than or equal to 10° C./sec. Ramp rates of 30° C. and 40° C. were also utilized and while a roughness increase of surface 22 to surface 24 was observed, the increase was not as significant where the ramp rate was kept at a lower rate of at or below 10° C./sec. The annealing second temperature is also kept at preferably below 700° C. to minimize the thermal budget of the wafer processing.

The reactor ambient during the annealing process is preferably kept at a vacuum pressure. Alternately, an inert atmosphere of for example $N_2$ can be utilized. Preferably, the reactor pressure during the amorphous silicon deposition and annealing steps is the same pressure, with such being greater than 0.01 Torr. Where an inert gas is provided within the reactor during the annealing step, reactor pressures of greater than or equal to 760 Torr can be utilized. This provides a significant and considerable advantage over the prior art process described above which fundamentally requires in combination, i) two furnace steps, ii) intervening exposure to oxygen, and iii) costly low reactor pressures of $10^{-8}$ Torr.

The invention was reduced to practice utilizing various combination of parameters. For example, actual anneals were conducted at wafer temperatures of 650° C., 660° C., 670° C., 680° C., 700° C., 750° C., 800° C. and 850° C. Reactor pressures varied from 400 mTorr to 80 Torr with and without $N_2$. Deposition times ranged from 3 seconds to 900 seconds. Temperature ramp rates between the amorphous silicon deposition and the annealing ranged from 4° C./sec to 10° C./sec. The best results at producing maximized surface roughness of surface 24 as compared to original surface 22 occurred at 670° C. for between 30 and 60 seconds, where the ramp rate between deposition and anneal was approximately 5° C./sec.

Figure 3:
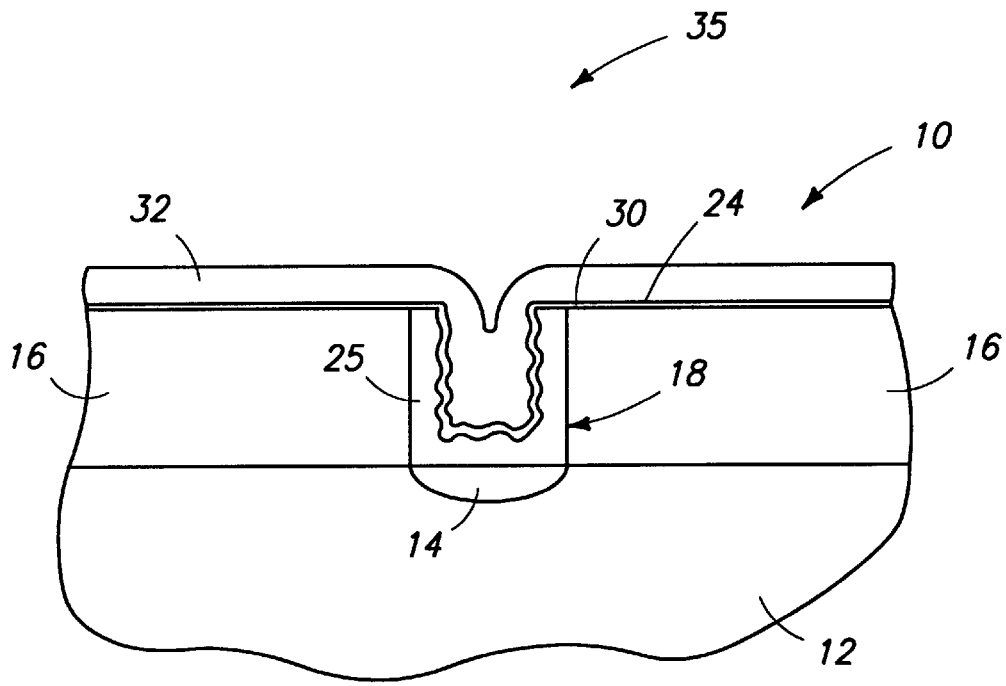
FIG. 3 is a view of the FIG. 1 wafer fragment at a processing step subsequent to that shown by FIG. 2.

Such a resultant surface is advantageously used in the formation of improved capacitor constructions. FIG. 3 illustrates polishing of layer 25 to be electrically isolated within container opening 18. Subsequently, a dielectric layer 30 and subsequently deposited outer capacitor plate 32 (preferably conductively doped polysilicon) are provided to complete formation of the capacitor construction 35.

Figure 4:
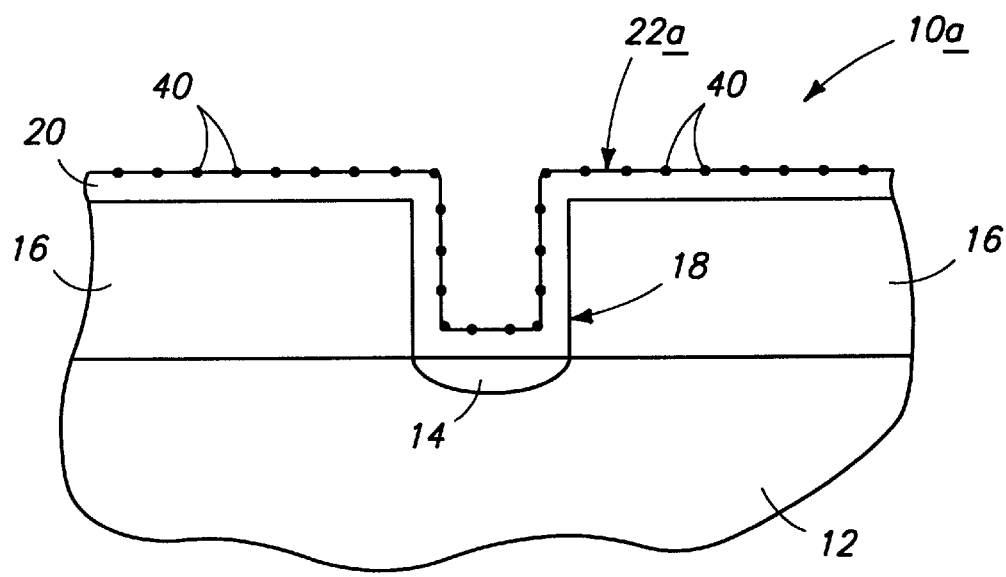
FIG. 4 is a diagrammatic sectional view of an alternate semiconductor wafer fragment at an alternate processing step in accordance with the invention.

FIGS. 4–6 illustrate an alternate embodiment construction and process in accordance with the invention which incorporates at least one additional process step over that depicted by FIGS. 1–3. Like numbers from the first described embodiment are utilized where appropriate, with differences being indicated with the suffix "a" or with different numerals. FIG. 4 illustrates the same essential FIG. 1 wafer fragment 10a incorporating additional features and at a subsequent processing step to that shown by FIG. 1. Specifically and after provision of in situ doped amorphous silicon layer 20, the substrate temperature is raised at a selected rate to a silicon seeding temperature. At the seeding temperature, a discontinuous layer of silicon seeds 40 is provided atop doped amorphous silicon layer 20. This occurs within the same reactor and without any intervening exposure of the wafer to oxidizing conditions between the time of amorphous silicon deposition and provision of the discontinuous seeds. The seeds constitute discrete clusters of silicon atoms.

A preferred process for providing the silicon seeds is to feed a silicon source gas to the reactor which comprises a gaseous compound of the formula $Si_nH_{2n+2}$, where "n" is an integer greater than or equal to 1. An example process in accordance with the above described embodiment would be to feed disilane gas to the reactor at a rate of 5 sccm to 10 sccm for from 30 to 60 seconds. Preferably, discontinuous silicon seeds 40 are provided to have a cluster diameter of from 10 Angstroms to 50 Angstroms. An example seeding temperature is 600° C., with the selected first ramp rate to the seeding temperature again being at or below 10° C./sec. The silicon seeding temperature is preferably at or below 600° C. The result is production of an inherently rougher outer surface 22a than layer 22 of the previous embodiment.

Referring to FIG. 5, the substrate again within the same chemical vapor deposition reaction and without any intervening exposure of the wafer to oxidizing conditions, is provided to the annealing temperature which is between 550° C. and 950° C. The annealing temperature will be at least as high as the seeding temperature, and preferably higher. If at a greater temperature, the preferred ramp rate is again at or below 10° C./sec. The substrate is maintained at the annealing temperature for a period of time sufficient to convert the doped amorphous layer into a doped polysilicon layer 25a having outer surface 24a, with such outer surface having a second degree of roughness which is greater than the first degree of roughness of amorphous silicon layer outer surface 22a.

An advantageous phenomenon occurs in utilization of silicon seeds 40. The amorphous silicon of layer 20 migrates on surface 22a and agglomerates onto the silicon seeds 40, creating bumps and valleys and therefore an even rougher outer polysilicon surface. FIG. 5 depicts the seeds 40 as being discrete at the conclusion to the processing step. More typically, such seeds would no longer exist as discrete clusters, and would rather constitute a part of the homogeneously formed polysilicon crystal lattice of layer 25a. An example annealing temperature wherein a silicon seeding temperature of 600° C. is utilized would be 630° C. Also possible in accordance with the invention, the annealing temperature and seeding temperature might be the same temperature, such that the second selected rate is 0° C./sec.

Referring to FIG. 6, layer 25a has been polished to be isolated within container opening 18. Subsequently, capacitor dielectric layers 30a and 32a are provided to produce a resultant capacitor construction 35a. Layers 30a and 32a will have slightly greater roughness than the first described embodiment due to the enhanced roughening produced by the seeding process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method, comprising:

placing a substrate within a chemical vapor deposition reactor;

while the substrate is within the chemical vapor deposition reactor, chemical vapor depositing an in situ conductively doped amorphous silicon layer onto the substrate at a first temperature, the first temperature being below 600° C., the doped amorphous silicon layer having an outer surface of a first degree of roughness;

within the chemical vapor deposition reactor and after depositing the doped amorphous silicon layer, raising the substrate temperature at a selected rate to a higher annealing second temperature, the annealing second temperature being from 550° C. to 950° C.; and maintaining the substrate at the annealing second temperature for a period of time sufficient to convert at least an outer portion of the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the doped amorphous silicon layer and its conversion to polysilicon.

2. The semiconductor processing method of claim 1 wherein the selected rate is less than or equal to 10° C./sec.

3. The semiconductor processing method of claim 1 wherein the annealing second temperature is less than 700° C.

4. The semiconductor processing method of claim 1 wherein the period is less than or equal to 60 seconds.

5. The semiconductor processing method of claim 1 wherein the reactor pressure during the amorphous silicon deposition and annealing steps is the same pressure.

6. The semiconductor processing method of claim 1 wherein is the reactor pressure during the amorphous silicon deposition and annealing steps is greater than or equal to 0.01 Torr.

7. The semiconductor processing method of claim 1 wherein the reactor pressure during the amorphous silicon deposition and annealing steps is greater than or equal to 760 Torr.

8. The semiconductor processing method of claim 1 wherein the reactor pressure during the amorphous silicon deposition and annealing steps is the same pressure, with such pressure being greater than or equal to 0.01 Torr.

9. The semiconductor processing method of claim 1 wherein the reactor pressure during the amorphous silicon deposition and annealing steps is the same pressure, with such pressure being greater than or equal to 760 Torr.

10. The semiconductor processing method of claim 1 wherein the selected rate is less than or equal to 10° C./sec, and the reactor pressure during the amorphous silicon deposition and annealing steps is the same pressure.

11. The semiconductor processing method of claim 1 wherein the selected rate is less than or equal to 10° C./sec, and the reactor pressure during the amorphous silicon deposition and annealing steps is greater than or equal to 0.01 Torr.

12. The semiconductor processing method of claim 1 wherein the selected rate is less than or equal to 10° C./sec, and the reactor pressure during the amorphous silicon deposition and annealing steps is greater than or equal to 760 Torr.

13. A semiconductor processing method, comprising:

placing a semiconductive substrate within a chemical vapor deposition reactor;

while the substrate is within the chemical vapor deposition reactor, chemical vapor depositing an in situ conductively doped amorphous silicon layer onto the substrate at a first temperature, the first temperature being below 600° C., the doped amorphous silicon layer having an outer surface of a first degree of roughness;

within the chemical vapor deposition reactor and after depositing the doped amorphous silicon layer, raising the substrate temperature at a first selected rate to a higher silicon seeding temperature;

with the substrate at the seeding temperature, depositing a discontinuous layer of silicon seeds atop the doped amorphous silicon layer;

within the chemical vapor deposition reactor and after depositing the discontinuous layer of silicon seeds atop the doped amorphous silicon layer, providing the substrate temperature at an annealing second temperature, the annealing second temperature being from 550° C. to 950° C.; and maintaining the substrate at the annealing second temperature for a period of time sufficient to convert at least an outer portion of the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the doped amorphous silicon layer and its conversion to polysilicon.

14. The semiconductor processing method of claim 13 wherein the step of depositing the discontinuous silicon seeds comprises feeding a silicon source gas to the reactor, the silicon source gas comprising a gaseous compound of the formula $Si_nH_{2n+2}$, where "n" is an integer greater than or equal to 1.

15. The semiconductor processing method of claim 13 wherein the second annealing temperature is greater than the seeding temperature, with the substrate temperature being raised to the second annealing temperature from the seeding temperature at a second selected rate.

16. The semiconductor processing method of claim 15 wherein the second rate is the same as the first rate.

17. The semiconductor processing method of claim 13 wherein the discontinuous silicon seeds are provided to have a diameter of from 10 Angstroms to 50 Angstroms.

18. The semiconductor processing method of claim 13 wherein the first selected rate is less than or equal to 10° C./sec.

19. The semiconductor processing method of claim 13 wherein the reactor pressure during the amorphous silicon deposition, the discontinuous deposition and the annealing steps is the same pressure.

20. The semiconductor processing method of claim 13 wherein the reactor pressure during the amorphous silicon deposition, the discontinuous deposition and the annealing steps is greater than or equal to 0.01 Torr.

21. The semiconductor processing method of claim 13 wherein the reactor pressure during the amorphous silicon deposition, the discontinuous deposition and the annealing steps is greater than or equal to 760 Torr.

22. The semiconductor processing method of claim 13 wherein the first selected rate is less than or equal to 10° C./sec, and the reactor pressure during the amorphous silicon deposition, the discontinuous deposition and the annealing steps is the same pressure.

23. The semiconductor processing method of claim 13 wherein the first selected rate is less than or equal to 10° C./sec, and the reactor pressure during the amorphous silicon deposition, the discontinuous deposition and the annealing steps is greater than or equal to 0.01 Torr.

24. The semiconductor processing method of claim 13 wherein the first selected rate is less than or equal to 10° C./sec, and the reactor pressure during the amorphous silicon deposition, the discontinuous deposition and the annealing steps is greater than or equal to 760 Torr.

25. A semiconductor processing method of forming a capacitor, comprising:

providing a semiconductive monocrystalline silicon substrate, forming a diffusion region within the semiconductive substrate;

forming an insulative layer over the semiconductive substrate;

forming an opening through the insulative layer, the diffusion region being exposed within said opening;

after forming the opening, placing the semiconductive substrate in a chemical vapor deposition reactor;

while the substrate is within the chemical vapor deposition reactor, chemical vapor depositing an in situ conductively doped amorphous silicon layer over the insulative layer and within the opening at a first temperature, the first temperature being below 600° C., the doped amorphous silicon layer having an outer surface of a first degree of roughness, the doped amorphous layer contacting the diffusion region;

within the chemical vapor deposition reactor and after depositing the doped amorphous silicon layer, raising the substrate temperature at a selected rate to a higher annealing second temperature, the annealing second temperature being from 550° C. to 950° C.;

maintaining the substrate at the annealing second temperature for a period of time sufficient to convert at least an outer portion of the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the doped amorphous silicon layer and its conversion to polysilicon;

after converting the at least an outer portion of the doped amorphous layer into a doped polysilicon layer, polishing the polysilicon layer to remove the polysilicon layer from over the insulative layer and to form a polished polysilicon layer within the opening;

forming a dielectric layer over the polished polysilicon layer and over the insulative layer; and forming an outer capacitor plate over the dielectric layer; the outer capacitor plate, dielectric layer and polysilicon layer together comprising a capacitor.

26. A semiconductor processing method of forming a capacitor, comprising:

providing a semiconductive monocrystalline silicon substrate, forming a diffusion region within the semiconductive substrate;

forming an insulative layer over the semiconductive substrate;

forming an opening through the insulative layer, the diffusion region being exposed within said opening;

after forming the opening, placing the semiconductive substrate in a chemical vapor deposition reactor;

while the substrate is within the chemical vapor deposition reactor, chemical vapor depositing an in situ conductively doped amorphous silicon layer over the substrate within the reactor at a first temperature, the first temperature being below 600° C., the doped amorphous silicon layer having an outer surface of a first degree of roughness;

within the chemical vapor deposition reactor and after depositing the doped amorphous silicon layer, raising the substrate temperature at a first selected rate to a higher silicon seeding temperature;

with the substrate at the seeding temperature, depositing a discontinuous layer of silicon seeds atop the doped amorphous silicon layer;

within the chemical vapor deposition reactor and after depositing the discontinuous layer of silicon seeds atop the doped amorphous silicon layer, providing the substrate temperature at an annealing second temperature, the annealing second temperature being from 550° C. to 950° C.;

maintaining the substrate at the annealing second temperature for a period of time sufficient to convert at least an outer portion of the doped amorphous layer into a doped polysilicon layer having an outer surface of a second degree of roughness, the second degree of roughness being greater than the first degree of roughness, the substrate not being removed from the reactor nor exposed to oxidizing conditions between the time of deposition of the doped amorphous silicon layer and its conversion to polysilicon;

after converting the at least an outer portion of the doped amorphous layer into a doped polysilicon layer, polishing the polysilicon layer to remove the polysilicon layer from over the insulative layer and to form a polished polysilicon layer within the opening;

forming a dielectric layer over the polished polysilicon layer and over the insulative layer; and forming an outer capacitor plate over the dielectric layer; the outer capacitor plate, dielectric layer and polysilicon layer together comprising a capacitor.

* * * * *

UNITED STATES PATENT AND TRADEMARK OFFICE
CERTIFICATE OF CORRECTION

PATENT NO : 6,143,620
DATED : November 7, 2000
INVENTOR(S) : Sujit Sharan et al.

It is certified that error appears in the above-identified patent and that said Letters Patent are hereby corrected as shown below:

Col 1, line 44 please delete "s".

Signed and Sealed this

First Day of May, 2001

Attest:

NICHOLAS P. GODICI

Attesting Officer    Acting Director of the United States Patent and Trademark Office